United States Patent
Chawla et al.

(10) Patent No.: US 11,257,543 B2
(45) Date of Patent: Feb. 22, 2022

(54) MEMORY MANAGEMENT DEVICE, SYSTEM AND METHOD

(71) Applicant: STMICROELECTRONICS INTERNATIONAL N.V., Geneva (CH)

(72) Inventors: Nitin Chawla, Noida (IN); Tanmoy Roy, Greater Noida (IN); Anuj Grover, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/894,527

(22) Filed: Jun. 5, 2020

(65) Prior Publication Data

US 2020/0411089 A1  Dec. 31, 2020

Related U.S. Application Data

(60) Provisional application No. 62/866,429, filed on Jun. 25, 2019.

(51) Int. Cl.
*G11C 13/00* (2006.01)
*G06F 9/50* (2006.01)
(Continued)

(52) U.S. Cl.
CPC .......... *G11C 13/004* (2013.01); *G06F 9/5016* (2013.01); *G06N 3/063* (2013.01);
(Continued)

(58) Field of Classification Search
CPC .............. G11C 13/004; G11C 13/0026; G11C 13/0028; G11C 13/0069; G11C 29/006;
(Continued)

(56) References Cited

U.S. PATENT DOCUMENTS 5,559,956 A * 9/1996 Sukegawa ........... G06F 12/0246
711/E12.014
6,205,063 B1 3/2001 Aipperspach et al.
(Continued)

OTHER PUBLICATIONS

Maliuk, et al., "Analog Neural Network Design for RF Built-In Self-Test", *International Test Conference*, Paper 23.2, 2010, 10 pages.
(Continued)

*Primary Examiner* — Ajay Ojha
(74) *Attorney, Agent, or Firm* — Seed IP Law Group LLP (57) ABSTRACT

A memory management circuit stores information indicative of reliability-types of regions of a memory array. The memory management circuitry responds to a request to allocate memory in the memory array to a process by determining a request type associated with the request to allocate memory. Memory of the memory array is allocated to the process based on the request type associated with the request to allocate memory and the stored information indicative of reliability-types of regions of the memory array. The memory array may be a shared memory array. The memory array may be organized into rows and columns, and the regions of the memory array may be the rows of the memory array.

33 Claims, 6 Drawing Sheets

(51) Int. Cl.
*G06N 3/063* (2006.01)
*G11C 29/00* (2006.01)
*G11C 29/26* (2006.01)
*G11C 29/44* (2006.01)

(52) U.S. Cl.
CPC ...... *G11C 13/0026* (2013.01); *G11C 13/0028* (2013.01); *G11C 13/0069* (2013.01); *G11C 29/006* (2013.01); *G11C 29/26* (2013.01); *G11C 2029/4402* (2013.01); *G11C 2211/561* (2013.01)

(58) Field of Classification Search
CPC ............ G11C 29/26; G11C 2029/4402; G11C 2211/561; G06F 9/5016; G06F 12/0246; G06F 12/0207; G06F 2212/1032; G06F 2212/7209; G06N 3/063
See application file for complete search history.

(56) References Cited

U.S. PATENT DOCUMENTS

| | | | |
|---|---|---|---|
| 7,647,536 B2 | 1/2010 | Dempsey et al. | |
| 8,605,527 B2 | 12/2013 | Shvydun et al. | |
| 9,558,107 B2 | 1/2017 | Camp et al. | |
| 9,912,352 B1 | 3/2018 | Qin et al. | |
| 10,622,088 B2 * | 4/2020 | Choi | G11C 29/46 |
| 10,650,902 B2 * | 5/2020 | Kannan | G11C 16/3495 |
| 2007/0033449 A1 * | 2/2007 | Hwang | G11C 29/021 |
| | | | 714/710 |
| 2015/0128007 A1 | 5/2015 | Kim | |
| 2016/0225436 A1 | 8/2016 | Wang et al. | |
| 2017/0185478 A1 | 6/2017 | Sakai et al. | |
| 2018/0285732 A1 | 10/2018 | Kurian et al. | |
| 2018/0308561 A1 | 10/2018 | Koker et al. | |
| 2018/0358110 A1 | 12/2018 | Buyuktosunoglu et al. | |
| 2019/0042966 A1 | 2/2019 | Hogaboam et al. | |
| 2019/0056987 A1 | 2/2019 | Busch et al. | |
| 2019/0068220 A1 | 2/2019 | Kumar et al. | |
| 2019/0073259 A1 | 3/2019 | Qin et al. | |
| 2019/0172542 A1 | 6/2019 | Miladinovic | |
| 2019/0294368 A1 * | 9/2019 | Hiraishi | G06F 3/0679 |

OTHER PUBLICATIONS

Azizimazreah, et al., "Tolerating Soft Errors in Deep Learning Accelerators with Reliable On-Chip Memory Designs", *2018 IEEE International Conference on Networking, Architecture and Storage (NAS)*, 2018, pp. 1-10.

Reagen, et al., "Minerva: Enabling Low-Power, Highly-Accurate Deep Neural Network Accelerators", *2016 ACM/IEEE 43rd Annual International Symposium on Computer Architecture (ISCA)*, 2016, pp. 267-278.

* cited by examiner

MEMORY MANAGEMENT DEVICE, SYSTEM AND METHOD

BACKGROUND

Technical Field

The present disclosure generally relates to memory configuration and management in processing systems having one or more processing cores running multiple processes sharing a memory, such as embedded systems implementing deep machine learning systems. For example, the present disclosure relates to embedded systems implementing artificial neural networks (ANNs), such as convolutional neural networks (CNNs).

Description of the Related Art

Processing cores and devices and systems including processing cores, such as processors, mobile phones, tablets, laptops, desktop computers, embedded processing systems, etc., may typically include one or more memories, such as cache memory, primary memory, secondary memory, etc. The memories may be implemented, for example, using one or more random access memories (RAM), which may be volatile or non-volatile. A RAM may be organized into rows and columns corresponding to data addresses in the memory.

Memory may be shared memory which may be used, for example, by multiple processing cores, multiple processes, such as host system processes, application processes, etc. Such processing systems may be implemented using one or more integrated circuits. The integrated circuits may include, for example, processing cores, memory arrays, memory controllers, discrete circuitry, etc., and various combinations thereof.

Memory arrays in integrated circuits may contain manufacturing defects which may render one or more cells of a memory array statistically incapable of accurately storing data. In addition, memory cells of a memory array may fail over time. For this reason, memory arrays may contain spare cells in redundant rows or columns, or both, which can be used to replace a failed row or column of the memory array.

An integrated circuit may be tested as part of the manufacturing process (e.g., at the electrical wafer sort (EWS) level) or periodically after the manufacturing process to identify failed rows and columns of memory arrays of the integrated circuit. For example, probe-testing, built-in-self-testing (BIST), etc., circuitry and testing routines may be employed. Failed rows or columns or both may be identified using thresholds (e.g., a number of failed cells in a row or column exceeding a threshold number), statistical analysis (e.g., a likelihood that error correction techniques, such as error-correction coding, will fail to correct errors in a row or column exceeding a threshold likelihood), etc., and various combinations thereof.

For example, various data patterns may be loaded into and read from the memory array, and the data read from the memory array may be analyzed to identify flipped bits. The flipped bit information can be used to identify, based on statistical analysis, failed rows and columns in a memory array.

If a row or column is identified as unusable, the memory array may be repaired by using one of the spare rows or columns to replace the failed row or column. Information identifying failed rows or columns is stored so that those rows and columns are not used to store data. When the number of failed rows or columns is too high (e.g., exceeds a threshold number or statistical chip failure probability), the integrated circuit including the memory array is determined to be unsuitable because it has too many non-repairable faults, and either discarded or possibly entirely repurposed (e.g., an integrated circuit designed to have a 6 GB memory array may be repurposed as a 4 GB memory array).

BRIEF SUMMARY

Processing systems, such as embedded systems implementing ANNs, may use a lot of memory. Implementing memory on-chip instead of off-chip may produce significant power savings, facilitating the use of ANNs and other memory intensive applications in, for example, embedded applications such as in mobile devices.

However, increasing the amount of memory on-chip may lead to significant yield losses. For example, an increased number of wafers and chips may be rejected during the manufacturing process because of unrepairable memory defects. Increased redundant memory may be employed to reduce yield loss, further increasing the chip area devoted to memory. In addition, memory may be statistically more likely to fail when operated at lower operating voltages.

In an embodiment, a device comprises: one or more memory cells, which, in operation, store information indicative of reliability-types of regions of a memory array; and memory management circuitry coupled to the one or more memory cells, wherein the memory management circuitry, in operation, responds to a request to allocate memory in the memory array to a process by: determining a request type associated with the request to allocate memory; and allocating memory in the memory array to the process based on the request type associated with the request to allocate memory and the stored information indicative of reliability-types of regions of the memory array. In an embodiment, the one or more memory cells comprise a bank of fuses. In an embodiment, each fuse is associated with a respective region of the memory array. In an embodiment, the one or more cells, in operation, store the information indicative of reliability-types of regions of the memory array as a memory map.

In an embodiment, the determining a request type comprises determining a type of process associated with the request. In an embodiment, the memory array is a shared memory array and the memory management circuitry, in operation: responds to a request received from a host system process by allocating from one or more regions of the memory array which the stored reliability information indicates has a first reliability-type. In an embodiment, the memory management circuitry, in operation: responds to a request received from an application process by allocating from one or more regions of the memory array which the stored reliability information indicates has the first reliability-type or a second reliability type, the second reliability type indicating the region is less-reliable than a region having the first reliability-type. In an embodiment, the memory management circuitry, in operation: responds to a request received from an artificial neural network (ANN) control process by allocating from one or more regions of the memory array which the stored reliability information indicates has the first reliability-type; and responds to a request from an ANN process to allocate memory to a memory buffer to store kernel data, intermediate partial sums, or feature data by allocating from one or more regions of the memory array which the stored reliability information indicates has the first reliability-type or a second reliability type, the second reliability type indicating the region is less-reliable than a region having the first reliability-type.

In an embodiment, the stored information indicative of reliability-types of regions of the memory array indicates one of a plurality of reliability levels associated with regions of the memory array. In an embodiment, the memory array is organized into rows and columns of memory cells, and a region is a row of the memory array.

In an embodiment, the device comprises built-in-self-test circuitry, which, in operation, periodically: tests the memory array; and updates the stored information indicative of the reliability of regions of the memory array based on results of the testing. In an embodiment, the one or more memory cells comprise a cut in the shared memory array. In an embodiment, the one or more memory cells comprise cells of a non-volatile memory. In an embodiment, the memory array comprises an array of non-volatile memory cells. In an embodiment, the array of non-volatile memory cells comprise one or more of: SRAM memory cells; ReRAM memory cells; and FRAM memory cells. In an embodiment, the array of non-volatile memory cells comprises one or more multilevel ReRAM memory cells.

In an embodiment, a system comprises: a memory array; and memory management circuitry coupled to the memory array, wherein the memory management circuitry, in operation, responds to a request to allocate memory in the memory array to a process of a plurality of processes by: determining a request type associated with the request to allocate memory; and allocating memory in the memory array to the process based on the request type associated with the request to allocate memory and stored information indicative of reliability-types of regions of the memory array. In an embodiment, the memory management circuitry comprises a bank of fuses, which, in operation, store the information indicative of reliability-types of regions of the memory array. In an embodiment, each fuse is associated with a respective region of the memory array. In an embodiment, the determining a request type comprises determining a type of process associated with the request. In an embodiment, the system comprises one or more processing cores executing the plurality of processes, and the memory management circuitry, in operation: responds to a request received from a host system process of the plurality of processes by allocating from one or more regions of the memory array which the stored reliability information indicates has a first reliability-type. In an embodiment, the memory management circuitry, in operation: responds to a request received from an artificial neural network (ANN) control process by allocating from one or more regions of the memory array which the stored reliability information indicates has the first reliability-type; and responds to a request from an ANN process to allocate memory to a memory buffer to store kernel data, intermediate partial sums, or feature data by allocating from one or more regions of the memory array which the stored reliability information indicates has the first reliability-type or a second reliability type, the second reliability type indicating the region is less-reliable than a region having the first reliability-type. In an embodiment, the stored information indicative of reliability-types of regions of the memory array indicates one of a plurality of reliability levels associated with regions of the memory array.

In an embodiment, a method comprises: storing information indicative of reliability-types of regions of a memory array; and responding to a request to allocate memory in the memory array to a process of a plurality of processes by: determining a request type associated with the request to allocate memory in the memory array; and allocating memory in the memory array to the process based on the request type associated with the request to allocate memory in the memory array and the stored information indicative of reliability-types of regions of the memory array. In an embodiment, the storing information indicative of reliability types of regions of the shared memory array comprises blowing fuses in a bank of fuses associated with the memory array. In an embodiment, the determining a request type comprises determining a type of process associated with the request. In an embodiment, the method comprises: responding to a request received from a host system process of the plurality of processes by allocating from one or more regions of the memory array which the stored reliability information indicates has a first reliability-type. In an embodiment, the method comprises: responding to a request received from an artificial neural network (ANN) control process by allocating from one or more regions of the memory array which the stored reliability information indicates has the first reliability-type; and responding to a request from an ANN process to allocate memory to a memory buffer to store kernel data, intermediate partial sums, or feature data by allocating from one or more regions of the memory array which the stored reliability information indicates has the first reliability-type or a second reliability type, the second reliability type indicating the region is less-reliable than a region having the first reliability-type.

In an embodiment, the method comprises: testing the memory array; and generating the stored information indicative of reliability-types of regions of the memory array based on results of the testing. In an embodiment, the testing is performed at a wafer level. In an embodiment, the method comprises: retesting the memory array; and updating the stored information indicative of reliability-types of regions of the memory array based on results of the retesting.

In an embodiment, a non-transitory computer-readable medium has contents which cause memory management circuitry to respond to a request to allocate memory in a memory array to a process of a plurality of processes by: determining a request type associated with the request to allocate memory in the memory array; and allocating memory in the memory array to the process based on the request type associated with the request to allocate memory in the memory array and stored information indicative of reliability-types of regions of the memory array. In an embodiment, the contents comprising instructions executed by the memory management circuitry. In an embodiment, the plurality of processes include host system processes and artificial neural network processes.

DETAILED DESCRIPTION

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, circuits, such as transistors, multipliers, adders, dividers, comparators, transistors, integrated circuits, logic gates, finite state machines, memories, interfaces, bus systems, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to." Reference to "at least one of" shall be construed to mean either or both the disjunctive and the inclusive, unless the context indicates otherwise.

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

Figure 1:
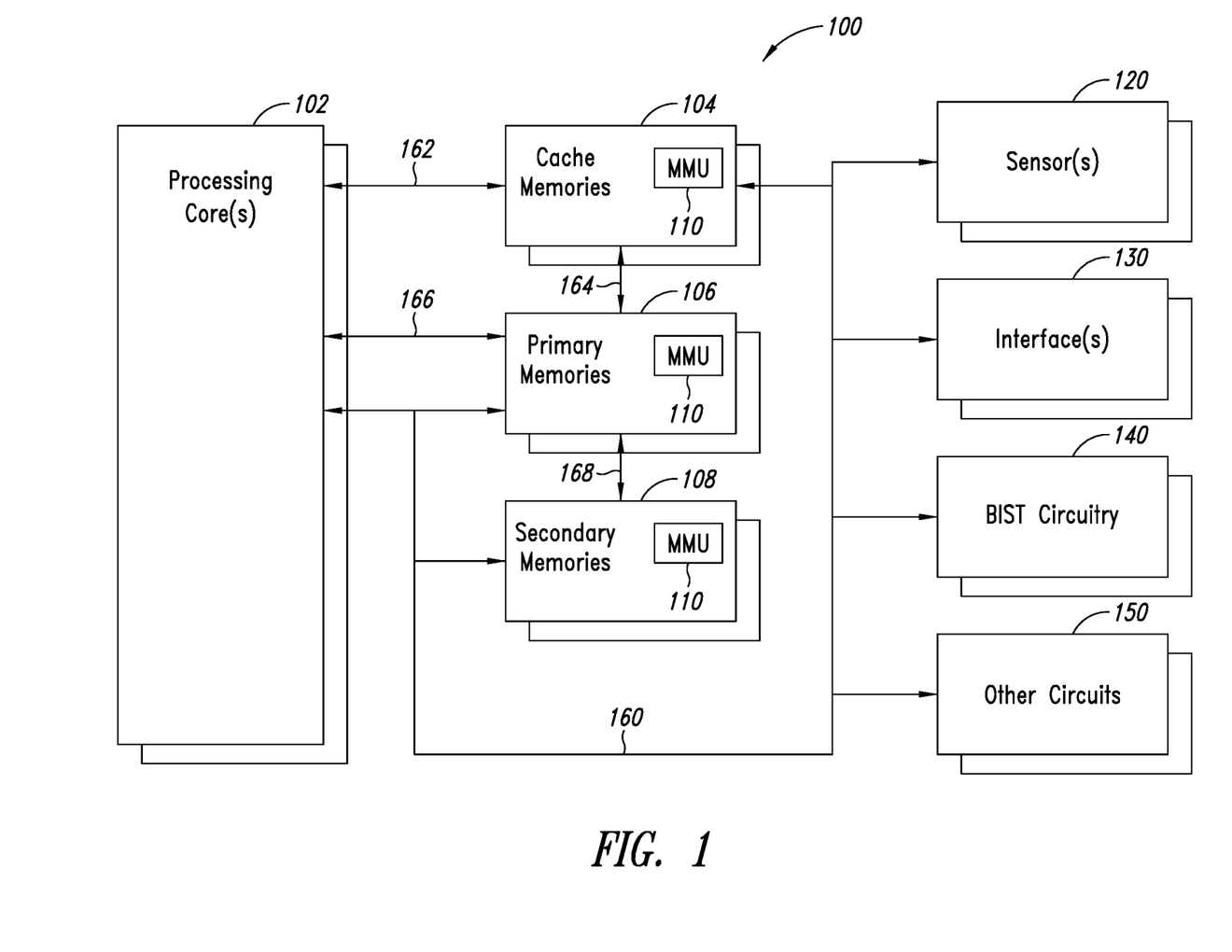
FIG. 1 is a functional block diagram of an embodiment of an electronic device or system having a processing core and a memory according to an embodiment.

FIG. 1 is a functional block diagram of an embodiment of an electronic device or system 100 of the type to which the embodiments which will be described may apply. The system 100 comprises one or more processing cores or circuits 102. The processing cores 102 may comprise, for example, one or more processors, a state machine, a microprocessor, a programmable logic circuit, discrete circuitry, logic gates, registers, etc., and various combinations thereof. The processing cores may control overall operation of the system 100, execution of application programs by the system 100, etc.

The system 100 includes one or more memories, such as one or more volatile and/or non-volatile memories which may store, for example, all or part of instructions and data related to control of the system 100, applications and operations performed by the system 100, etc. As illustrated, the system 100 includes one or more cache memories 104, one or more primary memories 106, and one or more secondary memories 108, each comprising memory management circuitry or MMUs 110. One or more of the memories 104, 106, 108 includes a memory array (see, e.g., memory array 302 of FIG. 3), which, in operation, may be shared by one or more processes executed by the system 100. The memory management circuitry 110, in operation, employs one or more memory management routines to allocate regions (see, e.g., regions 310 of FIG. 3, regions 410 of FIG. 4) of shared memory arrays (see, e.g., memory array 302 of FIG. 3) to various processes executed by the system 100, for example as discussed in more detail with reference to FIGS. 2-6.

The system 100 may include one or more sensors 120 (e.g., accelerometers, pressure sensors, temperature sensors, etc), one or more interfaces 130 (e.g., wireless communication interfaces, wired communication interfaces, etc.), one or more BIST circuits 140, and other circuits 150, which may include antennas, power supplies, etc., and a main bus system 160. The main bus system 160 may include one or more data, address, power and/or control buses coupled to the various components of the system 100. The system 100 also may include additional bus systems such as bus system 162, which communicatively couples the cache memory 104 and the processing core 102, bus system 164, which communicatively couples the cache memory 104 and the primary memory 106, bus system 166, which communicatively couples the primary memory 106 and the processing core 102, and bus system 168, which communicatively couples the primary memory 106 and the secondary memory 108.

The primary memory or memories 106 are typically the working memory of the system 100 (e.g., the memory or memories upon which the processing cores 102 work), and may typically be a volatile memory (e.g., DRAM) of a limited size storing code and data related to processes executed by the system 100. For convenience, reference herein to data stored in a memory may also refer to code stored in a memory. Non-volatile memories, such as SRAM, ReRAM (e.g., PCM, MRAM), FRAM, etc., may be employed as or in the primary memory or memories in an embodiment. The secondary memory 108 may typically be a non-volatile memory, which stores instructions and data, which may be retrieved and stored in the primary memory 106 when needed by the system 100. The cache memory 104 may be a relatively fast memory compared to the secondary memory 108 and typically has a limited size, which may be larger than a size of the primary memory 106.

The cache memory 104 temporarily stores code and data for later use by the system 100. Instead of retrieving needed code or data from the secondary memory 108 for storage in the primary memory 106, the system 100 may check the cache memory 104 first to see if the data or code is already stored in the cache memory 104. A cache memory 104 may significantly improve performance of a system, such as the system 100, by reducing the time and other resources needed to retrieve data and code for use by the system 100. When code and data are retrieved (e.g., from the secondary memory 108) for use by the system 100, or when data or code are written (e.g., to the primary memory 106 or to the secondary memory 108), a copy of the data or code may be stored in the cache memory 104 for later use by the system 100. Various cache management routines may be employed to control the data stored in the cache memory or memories 104.

Figure 2:
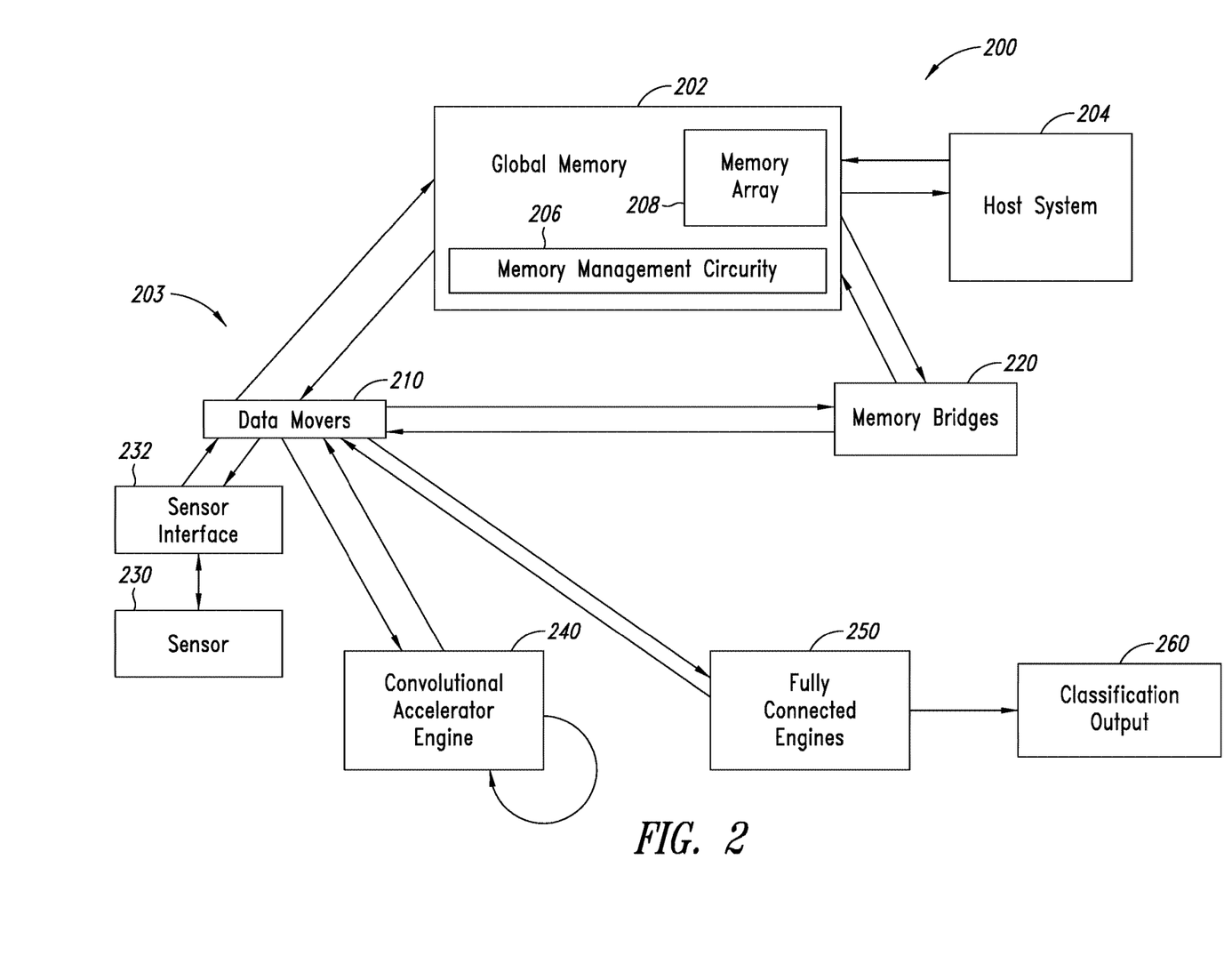
FIG. 2 is a functional block diagram of an embodiment of an electronic device or system implementing an artificial neural network.

FIG. 2 is a functional block diagram of another embodiment of an electronic device or system 200 of the type to which the embodiments which will be described may apply. The system 200 may be used, for example, to implement an ANN to classify sensor data. It is noted that the embodiment of FIG. 1 may be employed to implement the embodiment of FIG. 2, and may comprise a system on a chip.

The system 200 comprises a global memory 202, which may serve for example as a primary memory (see primary memory 106 of FIG. 1), for both ANN 203 processes or clusters, and for host system 204 processes or clusters. The global memory 202 comprises memory management circuitry 206 and one or more shared memory arrays 208. The memory management circuitry 206, in operation, employs one or more memory management routines to allocate regions of the shared memory arrays 208 to various processes executed by the system 200 based on request types and region reliability type information, for example as discussed in more detail with reference to FIGS. 3-6.

As illustrated, the ANN 203 comprises one or more data movers 210, one or more memory bridges 220, one or more sensors 230 and corresponding sensor interfaces 232, one or more convolutional accelerator engines 240, and one or more fully connected engines 250, which may be implemented and operate in an otherwise conventional manner to produce a classification output 260.

Efficient low power operation may be facilitated by using a hierarchical memory system and efficient reuse of local data. Accelerating CDNN convolutional layers may account for more than 90% of total operations. Efficient balancing of the computational and memory resources for both bandwidth and area may facilitate achieving better throughput without hitting associated ceilings. A design time configurable accelerator framework (CAF) (see FIG. 2) may be used based on unidirectional links transporting data streams via configurable data movers sources/sinks being I/O interfaces (e.g. cameras), memory hierarchies and various types of accelerators including the Convolution Accelerator (CA).

The data movers 210, in operation, move data streams between IOs (e.g., sensor interfaces 232), memory hierarchies (e.g., global memory 202, memory bridges 220), convolutional accelerators 240 and fully connected engines 250. In an embodiment, a full featured backpressure mechanism handles the data flow control and stream multicasting, facilitating the reuse of a data stream at multiple block instances. Linked lists may control the fully autonomous processing of entire convolution layers in ANN. Multiple accelerators may be grouped or chained to handle varying sizes for feature maps data and multiple kernels in parallel.

In an embodiment, the convolutional accelerator engines 240 may comprise an array of clustered multiply-accumulate (MAC) units or circuits, which, in operation, implement the convolutional layer processing in ANN. The convolutional accelerator engines may include a line buffer to fetch multiple feature map data words in parallel with a single memory access. A register-based kernel buffer may be used which provides multiple read ports, while a plurality of multibit fixed point MAC units or circuits perform multiple MAC operations per clock cycle. An adder tree may be employed to sum the MAC results for each kernel column. An overlapping, column based calculation of the MAC operations facilitates an optimal reuse of the feature maps data for multiple MACs and reducing of the power dissipation associated with redundant memory accesses.

In some embodiments, the system 100 or the system 200 may include more components than illustrated, may include fewer components than illustrated, may split illustrated components into separate components, may combine illustrated components, etc., and various combinations thereof. For example, the secondary memory 108 of FIG. 1 may comprise an external memory coupled to the system 100 through an interface, in addition to or instead of an internal secondary memory. In some embodiments, the primary memory 106 and the secondary memory 108 may be combined into a single memory. In some embodiments, the cache memory 104 may be omitted. In another example, the one or more primary memories 106 may share common memory management circuitry, in addition to or instead of separate MMUs 110.

Conventionally, system memory hierarchies are tested to ensure reliable operation at certain minimum voltages based on statistical models and accumulated memory density. If the predicted error rate for a memory array of an integrated circuit chip exceeds a threshold error rate, the chip is discarded. The statistical error rates of memories tend to be higher when the memories are operated at lower minimum voltages.

The inventors have realized that different processes or clusters sharing a memory array may tolerate different data error rates, and that this tolerance may be exploited to facilitate reducing overall system memory requirements, to increase chip yields, and to lower minimum operating voltages. For example, in an ANN system, a host process or cluster may, for practical purposes, need to employ memory having a lower error rate than needed by certain ANN processes or clusters. Thus, a higher overall error rate of a chip may be acceptable if the predicted failure rates for regions of the memory array are taken into consideration during allocation of memory of the memory array to different processes. A higher overall predicted failure rate facilitates reducing the number of rejected chips, lowering the amount of redundant memory employed, and operating chips using lower minimum operating voltages.

In the context of embedded ANN systems, the bulk of the on-chip memory for the ANN system may be needed to store kernel data, intermediate partial sums, and feature data, which are relatively fault tolerant, while a smaller portion may be needed to store configuration/layer sequence data, which are less fault tolerant. Similarly, host system processes may be less fault tolerant. Thus, allocating memory, such as a shared memory, based on the type of memory request (e.g., the purpose for which the memory is being allocated) and the error or reliability characteristics of regions of the memory may facilitate significantly increasing the yield of the chip fabrication process. In addition, the amount of memory needed for redundancy may be reduced, because rows and columns which conventionally may have been designated as unusable and replaced by redundant memory may instead be designated for allocation to certain types of processes, reducing the need for redundant memory. Minimum operating voltages also may be reduced, facilitating reduced usage of power in, for example, mobile devices.

Figure 3:
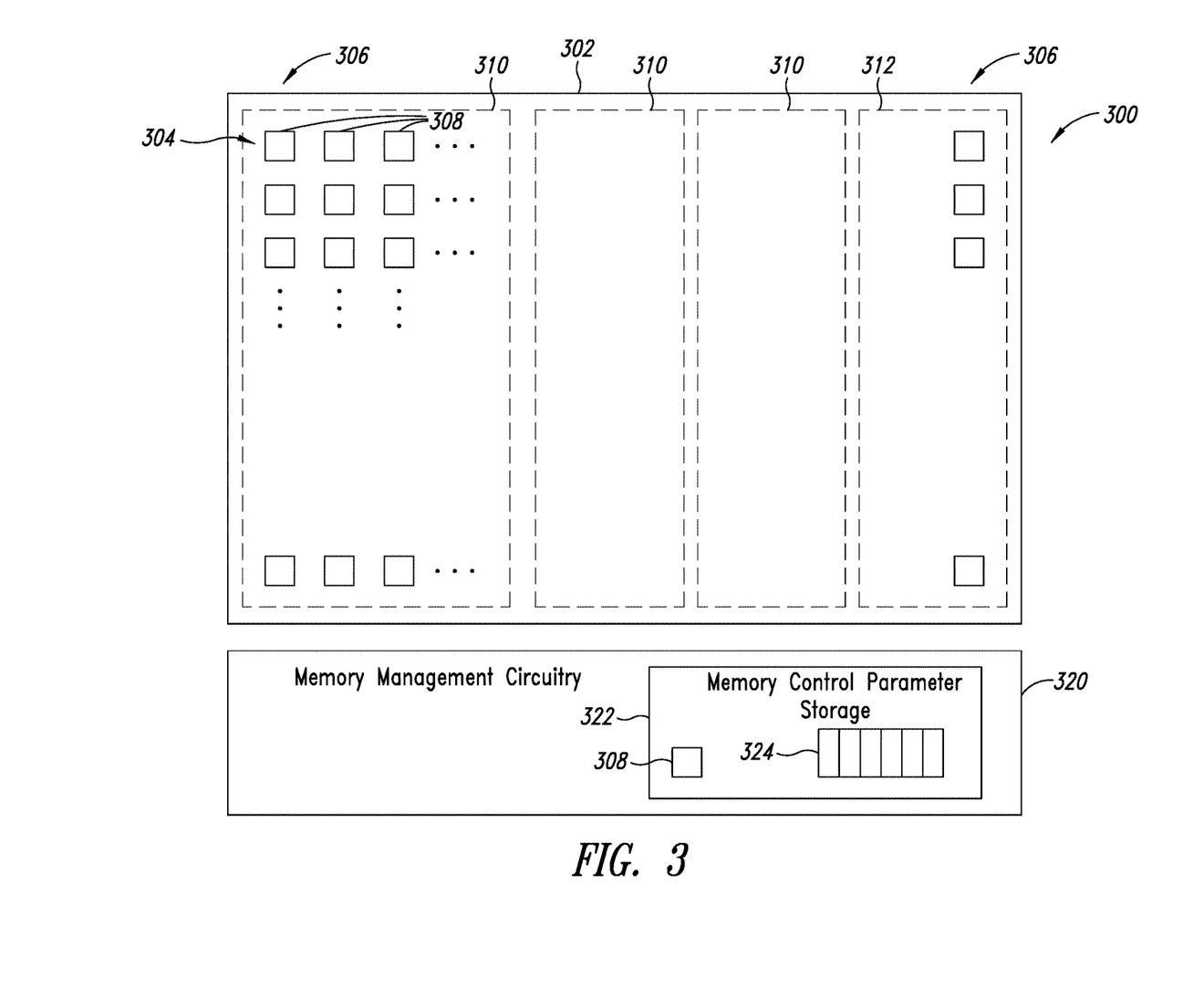
FIG. 3 illustrates an embodiment of a memory.

An example structure of a memory 300, which may, in operation, allocate memory regions based on allocation request types and information indicative of predicted or statistical data error rates of respective regions of memory arrays is shown in FIG. 3. The memory 300 may be used, for example, to implement one or more of the cache memory 104, the primary memory 106, and the secondary memory 108 of FIG. 1, the global memory 202 of FIG. 2, etc.

The memory 300 comprises one or more memory arrays 302. As illustrated, the memory array 302 is organized into a plurality of rows 304 and columns 306 of memory cells 308. The memory array 302 also is organized into a plurality of regions 310. The memory array 302 may be organized into regions 310 physically, logically, or various combinations thereof. The regions 310 may be of a uniform size (e.g., of a uniform number of rows 304 and columns 306), or of varying sizes. As illustrated, the regions 310 of FIG. 3 have a same number of rows 304, but different numbers of columns 306. The memory array 302 also includes a plurality of redundant columns 312, which may be used to replace failed columns 306 in the memory array 302.

Figure 4:
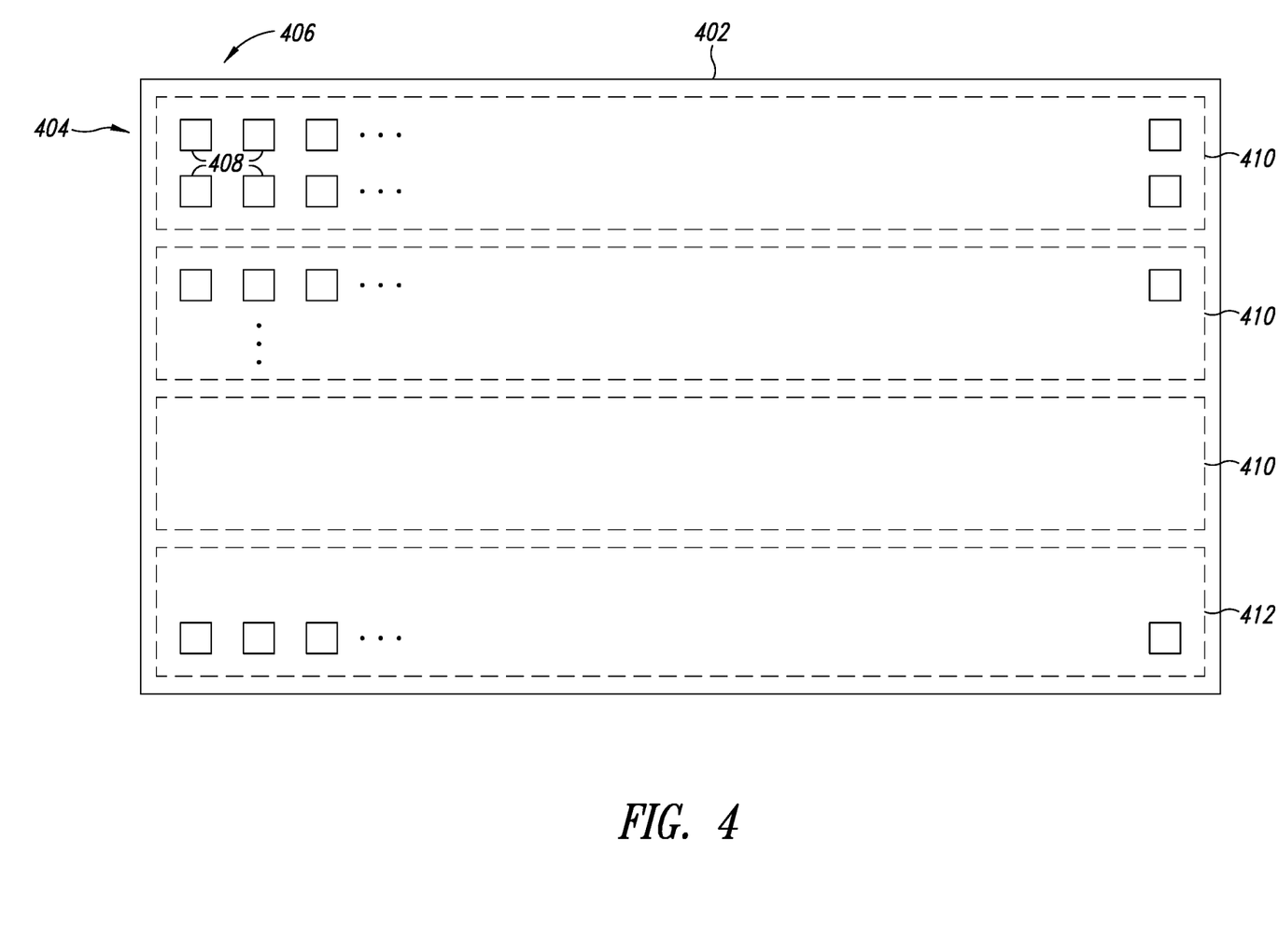
FIG. 4 illustrates an embodiment of a memory array.

FIG. 4 illustrates an embodiment of a memory array 402, which is similar to the memory array 302 of FIG. 3. The regions 410 of FIG. 4 have a same number of columns 406 of memory cells 408, and different numbers of rows 404. In an embodiment, each region 410 comprises a single row of the memory array 402. The memory array 402 of FIG. 4 also has a plurality of redundant rows 412, which may be used to replace failed rows 404 of the memory array 402. The memory array 402 may be employed, for example, in the embodiment of the memory 300 of FIG. 3, instead of or in addition to the memory array 302 of FIG. 3.

Various types of memory may be employed as the memory array 302 or the memory array 402. For example, dynamic random access memory (DRAM), static random access memory (SRAM), resistive random access memory (ReRAM) (e.g., phase-change memory (PCM), magnetic random access memory (MRAM), etc.), FRAM, etc., and various combinations thereof, may be employed. Multi-level memory cells (e.g., multilevel ReRAM cells) may be employed.

The memory 300 of FIG. 3 also comprises memory management circuitry 320 including memory control parameter storage 322. The memory control parameter storage includes one or more memory cells 308, which as illustrated include a bank of fuses 324. The memory control parameter storage 322, in operation, stores memory control parameters associated with regions 310 of the memory array 302. Alternatively or additionally, a cut in the memory array 302 may be used to store memory control parameters or a separate memory may be employed. The memory control parameters may comprise tags, for example, associated with regions of the memory.

The stored memory control parameters include region reliability-type parameters, such as parameters indicative of types of processes to which a region 310, 410 of the memory array 302, 402 may be allocated. Values of the region reliability-type parameters may be determined based, for example, on expected failure rates of the respective regions 310 of the memory array 302, failure rates associated with operation at different voltage levels, failure rates associated with operation in different modes (e.g., multilevel mode or binary mode), etc. For example, predicted failure rates based on testing of the memory array may be employed to determine values of the region reliability-type parameters. The stored memory control parameters may include other parameters, such as indications of whether a region or a portion thereof is currently allocated to a particular process, or available for allocation, historical allocation information, etc.

The stored reliability-type parameters may be employed by the memory management circuitry 320 to allocate available memory regions 310, 410 of the memory array 302, 402 to different processes or processors. For example, a memory region 310, 410 associated with a reliability-type parameter value indicative of a failure rate below a threshold failure rate may be determined by the memory management circuitry 320 to be available for allocation to all processes and processors. Conversely, a memory region 310, 410 associated with reliability-type parameter value indicative of a failure rate above the threshold failure rate may be determined by the memory management circuitry 320 to be available for allocation only to certain processes or processors. For example, allocation of a memory region 310, 410 associated with a parameter indicative of a failure rate above the threshold failure rate may be limited to certain processes, such as ANN kernel, intermediate partial sums, and feature data processes, while allocation of the region 310 to less fault tolerant processes, such as ANN configuration/layer sequence data storage and host system processes, would be prevented. The reliability-type parameters may be stored as a memory map.

In some embodiments, the reliability-type parameter values may be binary values associated with a region 310, 410 of the memory array 302, 402, with the values indicating whether the region is available for allocation without restriction, or whether allocation of the region should be restricted to certain processes.

In some embodiments, the reliability-type parameters values may be values which indicate one of a plurality of reliability levels associated with a region 310 of the memory 300. For example, a first value may indicate the region 310 may be allocated to any process, a second value may indicate allocation of the region 310 to host processes should be restricted, a third value may indicate allocation of the region 310 to host processes and ANN configuration/layer sequence data storage should be restricted, and a fourth value may indicate allocation of the region 310 to any process should be restricted.

In an embodiment, values of the region reliability type parameters may be stored in the bank of fuses 324. Tables 1 and 2 below indicate example correspondences between fuse states and reliability-type values with respect to four regions of an example memory array. Typically, a memory array would have substantially more than four regions, for example, if each row of a memory array is considered a region.

TABLE 1

Memory Region Associated With A Fuse

| Region of Memory Array | Fuse state | Reliability-type |
|---|---|---|
| 1 (e.g., rows 0-4) | Unblown | Unrestricted |
| 2 (e.g., rows 5-9) | Blown | Restricted |
| 3 (e.g., rows 10-14) | Blown | Restricted |
| 4 (e.g., rows 15-19) | Unblown | Unrestricted |

In Table 1, each region of a memory array is associated with a fuse. As can be seen, allocation of regions 1 and 4 is unrestricted (e.g., regions 1 and 4 may be allocated in response to any allocation request type), while allocation of regions 2 and 3 is restricted (e.g., in response to ANN kernel data storage process requests). Conventionally, regions 2 and 3 or portions thereof (e.g., rows) may have instead been deemed unusable, and the chip rejected because the failure rate for the chip was too high. In some embodiments, allocation of regions of the memory array associated with unblown fuses may be restricted to process types needing low data error rates (e.g., host processes) and allocation of regions of the memory array associated with blown fuses may be restricted to process types which are more tolerant of data errors (e.g., ANN kernel data storage processes).

TABLE 2

Memory Region Associated With Two Fuses

| Region | Fuse 1 | Fuse 2 | Reliability-Type |
|---|---|---|---|
| 1 | Unblown | Unblown | Level 0 Restriction (e.g., may be allocated to any process or request type) |
| 2 | Blown | Unblown | Level 1 Restriction (e.g., do not allocate to host processes or request types) |

TABLE 2-continued

Memory Region Associated With Two Fuses

| Region | Fuse 1 | Fuse 2 | Reliability-Type |
|---|---|---|---|
| 3 | Blown | Blown | Level 2 Restriction (e.g., do not allocate to host processes or to ANN configuration/layer sequence data storage processes or request types) |
| 4 | Unblown | Unblown | Level 0 Restriction |

In Table 2, each region of a memory array is associated with two fuses. As can be seen, regions 1 and 4 has a level 0 restriction, and may be allocated in response to any allocation request type. Region 2 has a level 1 restriction to prevent allocation in response to request types associated with host processes. Region 3 has a level 2 restriction to prevent allocation in response to request types associated with host processes or associated with ANN configuration/layer sequence data storage processes. In an embodiment, a state of fuse 1 as unblown and of fuse 2 as blown would not be employed. In some embodiments, allocation of regions of the memory array associated with certain fuse states may be restricted to request types associated with processes needing low data error rates (e.g., host processes) and allocation of regions of the memory array associated with other fuse states may be restricted to request types associated with processes which are more tolerant of data errors (e.g., ANN kernel data storage processes).

Figure 5:
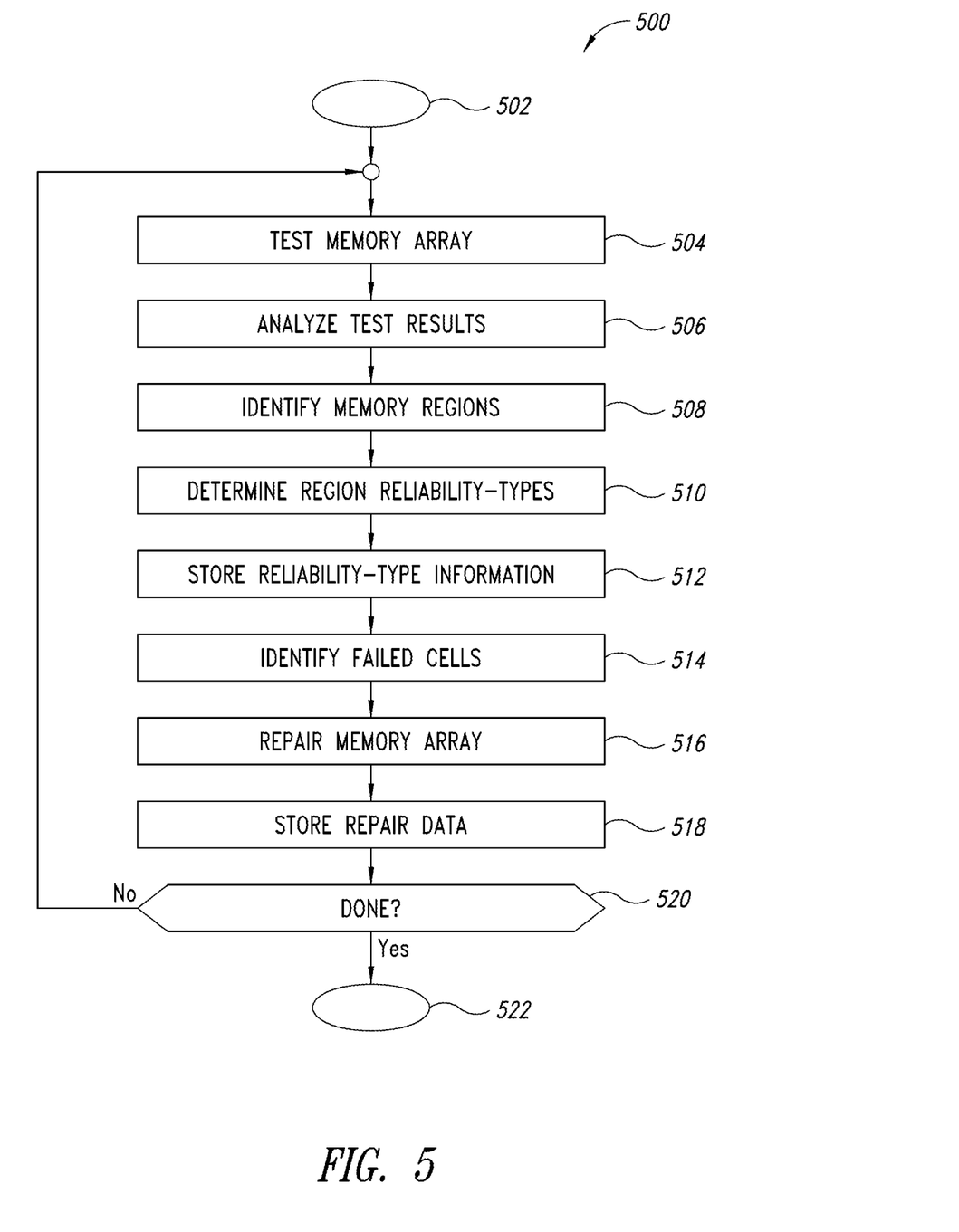
FIG. 5 illustrates an embodiment of a method of generating a region reliability type memory map.

FIG. 5 illustrates an embodiment of a method 500 of generating region reliability-type and failure information associated with a memory array, for example, during an integrated circuit manufacturing process or a boot process of an integrated circuit. The method 500 of FIG. 5 will be described for convenience with reference to FIGS. 1-4.

The method 500 starts at 502. The method 500 may be started, for example, as part of test routine employed during a chip manufacturing process, as part of a chip boot process, etc. The method 500 proceeds from 502 to 504.

At 504, the method 500 tests a memory array, such as the memory array 302 of FIG. 3 or the memory array 402 of FIG. 4. This may be done, for example, using testing probes (not shown), BIST circuitry (see BIST circuitry 140 of FIG. 1), testing routines, and various combinations thereof. Data patterns may be loaded into the memory array and read from the memory array to generate test results. The testing may include testing at various minimum operating voltage levels, in various operating modes (e.g., binary or multilevel mode, etc.). The method 500 proceeds from 504 to 506.

At 506, the method 500 analyzes the results of the testing at 504. This may be done, for example, using BIST circuitry (see BIST circuitry 140 of FIG. 1), statistical analysis of comparisons of the data read from the memory array to expected values, etc. For example, statistical failure rates of rows, columns or regions of the memory array may be determined based on statistical analysis of the results of the testing at 504. The method proceeds from 506 to 508.

At 508, the method 500 identifies regions of the memory array. The regions may, for example, be default regions, e.g., every row may be identified as a separate region, every five rows may be identified as a separate region, every column may be identified as a separate region, etc. The regions may be identified based on the test results. For example, every ten rows in order with a threshold failure rate below a first threshold may be grouped together and identified as a region; every ten rows in order with a threshold failure rate above the first threshold and below a second threshold failure rate may grouped together and identified as a region; every row with a threshold failure rate above the second threshold may be identified a separate region; etc. The method 500 proceeds from 508 to 510.

At 510, the method 500 determines region reliability-type information associated with the identified regions. For example, the method 500 may classify each region in a binary manner as having an unrestricted reliability-type or a restricted reliability-type based on statistical failure rates associated with the regions. See, for example, the discussion of binary region reliability-type values with respect to Table 1, above. In another example, the method 500 may classify each region to one of a plurality of reliability levels based on statistical failure rates associated with the respective regions, with respective regions in various operational modes, etc. See, for example, the discussion of region reliability levels with reference to Table 2, above. The statistical predicted failure rate of a region may be compared with one or more thresholds to determine the reliability-type of the region. The method proceeds from 510 to 512.

At 512, the method 500 stores information indicate of the reliability-types of the regions. For example, memory control parameter values indicative of the reliability-type information associated with regions of the memory array may be stored in the memory control parameter storage 322 of memory management circuitry 320 of FIG. 3 (e.g., stored in the bank of fuses 324; stored as tags associated with regions of the memory array; etc.). The information indicative of the reliability-types of the regions may be stored as a memory map. The stored control parameter values may be used, for example, together with allocation request type information, to allocate regions of the memory to system processes, such as host system 204 processes and ANN 203 processes of the system 200 of FIG. 2, etc. See, for example, FIG. 6 and the description thereof. The method 500 proceeds from 512 to 514.

At 514, the method 500 identifies failed cells in the memory array. In practice, this may be done, for example, by identifying failed rows (or columns) based on a comparison of statistical failure rates of the rows (columns) to a threshold failure rate. In comparison to conventional systems, the threshold failure rate may be higher (resulting in fewer failed rows) because a failure rate which conventionally would have resulted in the row being replaced with a redundant row, may instead be used to associate a reliability-type with the row. The method 500 proceeds from 514 to 516.

At 516, the method 500 repairs the memory array using redundant memory. For example, a failed row 404 of memory array 402 may be identified as unusable, and redundant row 412 identified as available for allocation to replace the failed row 404. The method 500 proceeds from 516 to 518.

At 518, the method 500 stores repair data associated with the memory array. For example, information identifying failed rows and redundant rows of the memory array 402 of FIG. 4 may be stored as a memory map, such as in the memory control parameter storage 322 of memory management circuitry 320 of FIG. 3. The method 500 proceeds from 518 to 520.

At 520, the method 500 determines whether the method 500 is finished or should continue. For example, when the memory array has been repaired at 516, the method 500 may determine that the method 500 is not finished in order to determine reliability information and failure information associated with redundant cells (e.g., redundant rows), used to replace failed cells in the memory array. When it is determined at 520 that the method 500 is finished, the method 500 proceeds from 520 to 522, whether the method 500 may terminate, may perform other processes (such as error processing), etc. When it is not determined at 520 that the method 500 is finished, the method 500 proceeds to from 520 to 504.

Embodiments of methods of generating reliability-type information associated with a memory array may contain additional acts not shown in FIG. 5, may not contain all of the acts shown in FIG. 5, may perform acts shown in FIG. 5 in various orders, and may be modified in various respects. For example, the method 500 may omit act 508 when default regions are employed; may combine acts 510 and 512; may perform acts 510 and 514 in various orders, in parallel or iteratively; may combine acts 512 and 518; etc.; and various combinations thereof.

Figure 6:
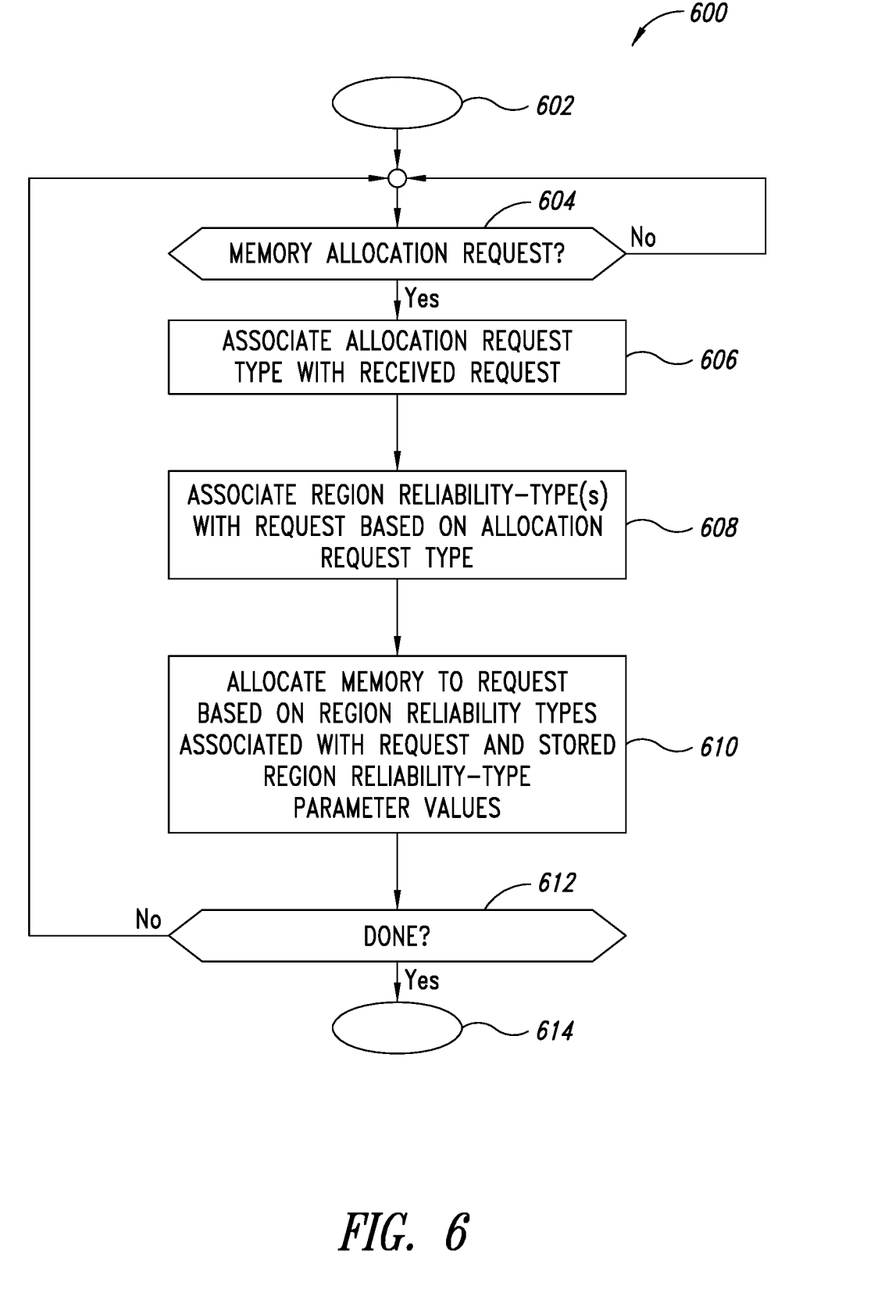
FIG. 6 illustrates an embodiment of a method of allocating memory in a memory array to a process based on region reliability type information.

FIG. 6 illustrates an embodiment of a method 600 of allocating memory of a shared memory to a process of a plurality of processes sharing the memory. The method 600 of FIG. 6 is described for convenience with reference to FIGS. 1-5. To simplify the discussion, the embodiment of FIG. 6 is discussed with reference to a single memory array, such as the memory array 208 of FIG. 2, the memory array 302 of FIG. 3, the memory array 402 of FIG. 4, etc. In some embodiments, the method 600 may be employed to allocate memory in a plurality of memory arrays of a shared memory, in a plurality of shared memories, etc.

The method 600 starts at 602. The method 600 may be started, for example, as part of memory management routine executing on a processing system, such as the system 100 of FIG. 1, the system 200 of FIG. 2, the host system 204 of FIG. 2, on memory management circuitry, such as the memory management circuitry 110 of FIG. 1, 206 of FIG. 2, 320 of FIG. 3, etc. The method 600 may be employed to allocate memory for host processes, application processes, data buffers of host and application processes, etc., and may allocate memory when processes are initialized and dynamically during runtime. The method 600 proceeds from 602 to 604.

At 604, the method 600 determines whether a request has been received to allocate memory of a shared memory array to a process. For example, a host system process or an application process, such as an ANN process, may request allocation of memory in a shared memory array. When it is not determined that a request has been received to allocate memory of a shared memory array, the method 600 returns to 604 to wait for a request to allocate memory of the shared memory array. In response to receipt of a request to allocate memory of the shared memory array, the method 600 proceeds from 604 to 606.

At 606, the method 600 associates one or more request types with the received request to allocate memory. This may be done, for example, by parsing the received request to determine a request type, by determining an origin of the request, etc. For example, the request may include a process identifier, a process type, other information indicative of a request type to be associated with the received request, a request type field, etc. In another example, requests received from a first processor of a plurality of processors may be associated with a first request type, and requests received from another processor of the plurality of processor may be associated with a second request type.

In an embodiment, requests received from a host process may be associated with a first request type. Requests received from an ANN process may be associated with a second request type if the ANN process is a control ANN configuration/layer sequence data storage process, and associated with a third request type if the ANN process is requesting a buffer to store kernel data, intermediate partial sums, or feature data. Default memory allocation request types may be employed. The method 600 proceeds from 606 to 608.

At 608, the method 600 associates one or more region reliability-types with the received memory allocation request based on the determined request type associated with the received memory allocation request. For example, a memory allocation request associated with a first request type may be associated with a first region reliability-type and a memory allocation request associated with a second request type may be associated with a first and a second region reliability-type. Look-up tables may be employed to associate the received allocation request with one or more region reliability-types. The method 600 proceeds from 608 to 610.

At 610, the method 600 allocates memory in a memory array in response to the memory allocation request based on the region reliability-types associated with the memory allocation request and stored information indicative of the region reliability-types of regions of the memory array. For example, the method 600 may allocate all or part of one or more regions having a first region reliability-type in response to a memory request associated with the first region reliability type, and may allocate all or part of one or more regions having a first region reliability-type or a second region reliability-type in response to a memory request associated with the second region reliability-type. Stored information indicate of region reliability-types of regions of the memory array may be employed to select regions of the memory array to allocate in response to the memory allocation request.

For example, with reference to FIGS. 2-4 and Table 1 (with the states of the fuses stored, for example, in the bank of fuses 324), a request from a host system 204 may be associated at 606 with a request type indicating the allocation request is related to a process which is less tolerant of data errors. At 608, the request is associated with an unrestricted reliability type. At 610, based on the states of the fuses 324, the method 600 may allocate all or part (e.g., with references to FIG. 4, one or more rows of a region 410) of region 1 and region 4 in response to the allocation request from the host system 204; regions 2 and 3 would not be allocated in response to the request from the host system. A request received from an ANN process 203 for a buffer to store kernel data, intermediate partial sums, or feature data may instead, at 606, be associated with a request type indicating the allocation request is related to a process which is more tolerant of data errors (e.g., a process less-sensitive to flipped bits). At 608, the request would be associated with a restricted reliability-type. At 610, based on the states of the fuses 324, the method 600 may allocate all or part of one or more of region 1, region 2, region 3 and region 4 in response to the allocation request from the ANN process.

In another example, with reference to FIGS. 2-4 and Table 2 (with the states of the fuses stored, for example, in the bank of fuses 324), a request from a host system 204 may be associated at 606 with a request type indicating the allocation request is related to a process which is less tolerant of data errors. At 608, the request would be associated with reliability-type restriction level 0. At 610, based on the states of the fuses 324, the method 600 may allocate rows of one or more of region 1 and region 4 in response to the allocation request from the host system 204; rows from regions 2 and 3 would not be allocated in response to the request from the host system. A request received from an ANN process 203 to store ANN configuration/layer sequence data may instead, at 606, be associated with a request type indicating the allocation request is related to a process which is moderately tolerant of data errors. At 608, the request is associated with reliability-type restriction level 1. At 610, based on the states of the fuses 324, the method 600 may allocate rows of one or more of region 1, region 2 and region 4, but not region 3, in response to the allocation request from the ANN process to store ANN configuration/layer sequence data. A request received from an ANN process 203 for a buffer to store kernel data, intermediate partial sums, or feature data may instead, at 606, be associated with a request type indicating the allocation request is related to a process which is more tolerant of data errors. At 608, the request is associated with reliability-type restriction level 2. At 610, based on the states of the fuses 324, the method 600 may allocate all or part of one or more of region 1, region 2, region 3 and region 4 in response to the allocation request from the ANN process for a buffer to store kernel data, intermediate partial sums, or feature data.

Of course, the method 600 may allocate regions of the memory array in response to an allocation request based on other factors in addition to the region reliability-type values associated with a memory allocation request, such as other memory control parameters, for example, stored in the memory control parameter storage 322 of FIG. 3, allocation selection routines designed to promote even wear of the memory, cache management control algorithms, limits on amounts of memory allocated to certain types of tasks, a total amount of unallocated memory available in the memory array, an operational mode of the memory region (e.g., multilevel, binary), etc., and various combinations thereof. Other memory management routines may be employed (e.g., error processing routines, routines to release allocated memory when no longer needed by a process, etc.)

The method 600 proceeds from 610 to 612, where the method 600 determines whether allocation of memory in the memory array is finished or should continue. When it is determined at 612 that the method 600 is finished, the method 600 proceeds from 612 to 614, whether the method 600 may terminate, may perform other processes (such as error processing), etc. When it is not determined at 612 that the method 600 is finished, the method 600 proceeds to from 612 to 604.

Embodiments of methods of allocating memory of a shared memory may contain additional acts not shown in FIG. 6, may not contain all of the acts shown in FIG. 6, may perform acts shown in FIG. 6 in various orders, and may be modified in various respects. For example, the method 600 may combine acts 606 and 608. For example, a lookup table may be used to associate a received allocation request with one or more region reliability-types. In another example, an operation mode of an allocated region may be determined at 610, for example, based on an allocation request type associated with the request.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various embodiments and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   one or more memory cells of a cut of a memory array, which, in operation, store information indicative of reliability-types of regions of the memory array, wherein the memory array is organized as a shared memory array having a plurality of rows of memory cells intersecting a plurality of columns of memory cells; and
   memory management circuitry coupled to the one or more memory cells of the cut of the memory array, wherein the memory management circuitry, in operation, responds to a request to allocate memory in the memory array to a process sharing the memory array by:
   determining a request type associated with the request to allocate memory; and
   allocating memory in the memory array to the process based on the request type associated with the request to allocate memory and the stored information indicative of reliability-types of regions of the memory array stored in the cut of the memory array.

2. The device of claim 1 wherein the stored information includes information associated with respective regions of the memory array.

3. The device of claim 1 wherein the one or more cells, in operation, store the information indicative of reliability-types of regions of the memory array as a memory map.

4. The device of claim 1 wherein the determining a request type comprises determining a type of process associated with the request.

5. The device of claim 4 wherein the memory management circuitry, in operation:
   responds to a request received from a host system process by allocating from one or more regions of the memory array which the stored reliability information indicates has a first reliability-type.

6. The device of claim 5 wherein the memory management circuitry, in operation:

responds to a request received from an application process by allocating from one or more regions of the memory array which the stored reliability information indicates has the first reliability-type or a second reliability type, the second reliability type indicating the region is less-reliable than a region having the first reliability-type.

7. The device of claim 5 wherein the memory management circuitry, in operation:
responds to a request received from an artificial neural network (ANN) control process by allocating from one or more regions of the memory array which the stored reliability information indicates has the first reliability-type; and
responds to a request from an ANN process to allocate memory to a memory buffer to store kernel data, intermediate partial sums, or feature data by allocating from one or more regions of the memory array which the stored reliability information indicates has the first reliability-type or a second reliability type, the second reliability type indicating the region is less-reliable than a region having the first reliability-type.

8. The device of claim 1 wherein the stored information indicative of reliability-types of regions of the memory array indicates one of a plurality of reliability levels associated with regions of the memory array.

9. The device of claim 1 wherein a region is a row of the memory array.

10. The device of claim 1, comprising built-in-self-test circuitry, which, in operation, periodically:
tests the memory array; and
updates the stored information indicative of the reliability of regions of the memory array based on results of the testing.

11. The device of claim 1 wherein the one or more memory cells comprise cells of a non-volatile memory.

12. The device of claim 1 wherein the memory array comprises an array of non-volatile memory cells.

13. The device of claim 12 wherein the array of non-volatile memory cells comprise one or more of:
SRAM memory cells;
ReRAM memory cells; and
FRAM memory cells.

14. The device of claim 12 wherein the array of non-volatile memory cells comprises one or more multilevel ReRAM memory cells.

15. A system, comprising:
a memory array organized as an array of a plurality of rows of memory cells intersecting a plurality of columns of memory cells; and
memory management circuitry coupled to the memory array, wherein the memory management circuitry, in operation, responds to a request to allocate memory in the memory array to a process of a plurality of processes sharing the memory array by:
determining a request type associated with the request to allocate memory; and
allocating memory in the memory array to the process based on the request type associated with the request to allocate memory and stored information indicative of reliability-types of regions of the memory array, wherein the stored information indicative of reliability-types of regions of the memory array is stored in a cut of the memory array.

16. The system of claim 15 wherein the stored information includes information associated with respective regions of the memory array.

17. The system of claim 15 wherein the determining a request type comprises determining a type of process associated with the request.

18. The system of claim 17, comprising one or more processing cores executing the plurality of processes, wherein the memory management circuitry, in operation:
responds to a request received from a host system process of the plurality of processes by allocating from one or more regions of the memory array which the stored reliability information indicates has a first reliability-type.

19. The system of claim 18 wherein the memory management circuitry, in operation:
responds to a request received from an artificial neural network (ANN) control process by allocating from one or more regions of the memory array which the stored reliability information indicates has the first reliability-type; and
responds to a request from an ANN process to allocate memory to a memory buffer to store kernel data, intermediate partial sums, or feature data by allocating from one or more regions of the memory array which the stored reliability information indicates has the first reliability-type or a second reliability type, the second reliability type indicating the region is less-reliable than a region having the first reliability-type.

20. The system of claim 15 wherein the stored information indicative of reliability-types of regions of the memory array indicates one of a plurality of reliability levels associated with regions of the memory array.

21. A method, comprising:
storing information indicative of reliability-types of regions of a memory array in a cut of the memory array, the memory array being organized as a plurality of rows of memory cells intersecting a plurality of columns of memory cells; and
responding to a request to allocate memory in the memory array to a process of a plurality of processes sharing the memory array by:
determining a request type associated with the request to allocate memory in the memory array; and
allocating memory in the memory array to the process based on the request type associated with the request to allocate memory in the memory array and the stored information indicative of reliability-types of regions of the memory array stored in the cut of the memory array.

22. The method of claim 21 wherein the determining a request type comprises determining a type of process associated with the request.

23. The method of claim 22, comprising:
responding to a request received from a host system process of the plurality of processes by allocating from one or more regions of the memory array which the stored reliability information indicates has a first reliability-type.

24. The method of claim 23, comprising:
responding to a request received from an artificial neural network (ANN) control process by allocating from one or more regions of the memory array which the stored reliability information indicates has the first reliability-type; and
responding to a request from an ANN process to allocate memory to a memory buffer to store kernel data, intermediate partial sums, or feature data by allocating from one or more regions of the memory array which the stored reliability information indicates has the first reliability-type or a second reliability type, the second reliability type indicating the region is less-reliable than a region having the first reliability-type.

25. The method of claim 21, comprising:
testing the memory array; and
generating the stored information indicative of reliability-types of regions of the memory array based on results of the testing.

26. The method of claim 25 wherein the testing is performed at a wafer level.

27. The method of claim 25, comprising:
retesting the memory array; and
updating the stored information indicative of reliability-types of regions of the memory array based on results of the retesting.

28. A non-transitory computer-readable medium having contents which cause memory management circuitry to respond to a request to allocate memory in a memory array to a process of a plurality of processes by:
determining a request type associated with the request to allocate memory in the memory array, the memory array being organized as a plurality of rows of memory cells intersecting a plurality of columns of memory cells; and
allocating memory in the memory array to the process of the plurality of processes sharing the memory array based on the request type associated with the request to allocate memory in the memory array and stored information indicative of reliability-types of regions of the memory array, wherein the stored information indicative of reliability-types of regions of the memory array is stored in a cut of the memory array.

29. The non-transitory computer-readable medium of claim 28 wherein the contents comprising instructions executed by the memory management circuitry.

30. The non-transitory computer-readable medium of claim 28 wherein the plurality of processes include host system processes and artificial neural network processes.

31. The device of claim 1, wherein the stored information indicative of reliability-types of regions of the memory array includes information indicative of a reliability of a region of the memory array associated with an operational voltage level.

32. The system of claim 15, wherein the stored information indicative of reliability-types of regions of the memory array includes information indicative of a reliability of a region of the memory array associated with an operational voltage level.

33. The method of claim 21, wherein the storing information indicative of reliability-types of regions of the memory array includes storing information indicative of a reliability of a region of the memory array associated with an operational voltage level.

* * * * *